(12) United States Patent
Kato

(10) Patent No.: US 6,424,235 B1
(45) Date of Patent: Jul. 23, 2002

(54) LAMINATED LC FILTER

(75) Inventor: Noboru Kato, Sabae (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/566,327

(22) Filed: May 8, 2000

(30) Foreign Application Priority Data

May 7, 1999 (JP) .......................................... 11-127819

(51) Int. Cl.[7] .................................................. H03H 7/01
(52) U.S. Cl. ...................................... 333/185; 333/184
(58) Field of Search ................................. 333/184, 185

(56) References Cited

U.S. PATENT DOCUMENTS 5,892,415 A * 4/1999 Okamura ................ 333/185 X
6,191,667 B1 * 2/2001 Takenaka et al. ........... 333/185

FOREIGN PATENT DOCUMENTS

JP       2000-021633       * 1/2000

* cited by examiner

Primary Examiner—Justin P. Bettendorf
(74) Attorney, Agent, or Firm—Keating & Bennett, LLP

(57) ABSTRACT

A laminated LC filter has an excellent Q characteristic and includes at least three LC resonators. Each of the LC resonators includes an inductor pattern and a capacitor pattern. The pattern widths of the inductor patterns of the LC resonator located at the approximate center portion are wider than the pattern widths of the inductor patterns of the LC resonators located at both ends.

10 Claims, 7 Drawing Sheets

PRIOR ART

LAMINATED LC FILTER

BACKGROUND OF THE INVENTION

1. Field of the Invention

The present invention relates to an LC filter, and more particularly, to a high frequency laminated LC filter.

2. Description of the Related Art

In general, a circuit structure of a band pass filter having three or more stages that transmits a signal having a specific frequency is shown in FIG. 8. The band pass filter is a three-stage band pass filter having LC resonators Q1 to Q3 of the first to third stages. These LC resonators Q1 to Q3 are such that the adjacent resonators are electrically coupled by the coupling capacitors Cs1, Cs2.

FIGS. 9 to 11 show conventional laminated band pass filter configurations used in the circuit structure described above. LC filter 1 illustrates a conventional filter used for LC resonators Q1 to Q3 of the first to the third stages. The laminate body 21 is constructed by stacking up the square shaped ceramic sheets 2. LC resonators Q1 to Q3 of the circuit shown in FIG. 8 include LC filters as shown in FIG. 9.

The inductors L1 to L3 of the LC resonators Q1 to Q3, respectively, include inductor patterns 3, 4, 5 as shown in FIG. 9. The inductor patterns 3, 4, 5 have the same pattern widths. The capacitors C1 to C3 of the LC resonators Q1 to Q3, respectively, are defined by the capacitor patterns 9, 10, 11, and leading edges 6, 7, 8 of the inductor patterns 3, 4, 5 that are disposed opposite to these capacitor patterns 9, 10, 11. The above-described LC resonators Q1 to Q3 are electrically connected by the coupling capacitors Cs1, Cs2 that are defined by the capacitor patterns 9 to 11 and the coupling capacitor patterns 12, 13 that are disposed opposite these capacitor patterns 9 to 11. These LC resonators Q1 and Q3 are capacitive-coupled to the capacitor pattern 14 to provide an input, and to the capacitor pattern 15 to provide an output, respectively. The shielding patterns 16a, 16b are arranged to sandwich these patterns 3 to 5, 9 to 15.

In the laminated body 21, an input terminal electrode 26, an output terminal electrode 27 and shielding terminal electrodes 28, 29 as shown in FIG. 10 are provided. The capacitor pattern 14 defining the input is connected to the input terminal electrode 26, and the capacitor pattern 15 defining the output is connected to the output terminal electrode 27. The lead portions of the inductor patterns 3, 4, 5 and one end portion of the shielding pattern 16a, 16b are connected to the shielding terminal electrode 28. The lead portions of the capacitor patterns 9 to 11 and the other end portion of the shielding pattern 16a, 16b are connected to the shielding terminal electrode 29.

In general, the inductor pattern 4 that defines the LC resonator Q2 at the second stage which located at the center is such that the magnetic field concentration at the pattern edge is larger, than the magnetic field concentration of the inductor patterns 3, 5 that define the LC resonators Q1, Q3 at the first and third stages which are located at the ends. Accordingly, a current density flowing through the inductor pattern 4 becomes larger than a current density flowing through the inductor patterns 3, 5, and thus, the current density produced is not uniform. As a result, an LC filter having this construction produces a poor Q characteristic.

SUMMARY OF THE INVENTION

In order to overcome the problems described above, preferred embodiments of the present invention provide a laminated LC filter having an excellent Q characteristic.

A laminated LC filter of a preferred embodiment of the present invention includes a laminated body including a plurality of insulation layers, a plurality of inductor patterns, and a plurality of capacitor patterns which are stacked on each other, and at least three LC resonators having a plurality of inductors that are defined by inductor patterns, and a plurality of capacitors arranged such that the capacitor patterns are disposed opposite to the inductor patterns inside of the laminated body, wherein a filter including at least three stages is constructed by connecting at least three of the LC resonators. The pattern widths of the inductor patterns defining the LC resonators at locations other than both ends thereof are wider than the pattern widths of the inductor patterns defining the LC resonators at both end locations. Further, the pattern widths of the inductor patterns defining the LC resonators are reduced at the end portions thereof.

Each of the inductors of the respective LC resonators has a multiplex structure in which two or more of the inductor patterns having substantially identical shapes are laminated via insulation layers.

The reduced pattern widths of the inductor patterns of the LC resonators at the end portions greatly reduce the magnetic field at the edges of the inductor patterns.

Moreover, the multiplex structure of the inductor greatly reduces the magnetic field generated in the vicinity of the inductor. As a result, the magnetic field at the edges of the inductor patterns is greatly decreased.

Other features, elements, characteristics and advantages of the present invention will become apparent from the detailed description of preferred embodiments thereof with reference to the drawings attached hereto.

DETAILED DESCRIPTION OF PREFERRED EMBODIMENTS

In the following, preferred embodiments of the laminated LC filter according to the present invention will be described with reference to the accompanying drawings. Each preferred embodiment is described below with reference to a band pass filter as an example of a suitable LC filter. However, preferred embodiments of the present invention may also be band eliminating filters and other suitable filters.

Figure 1:
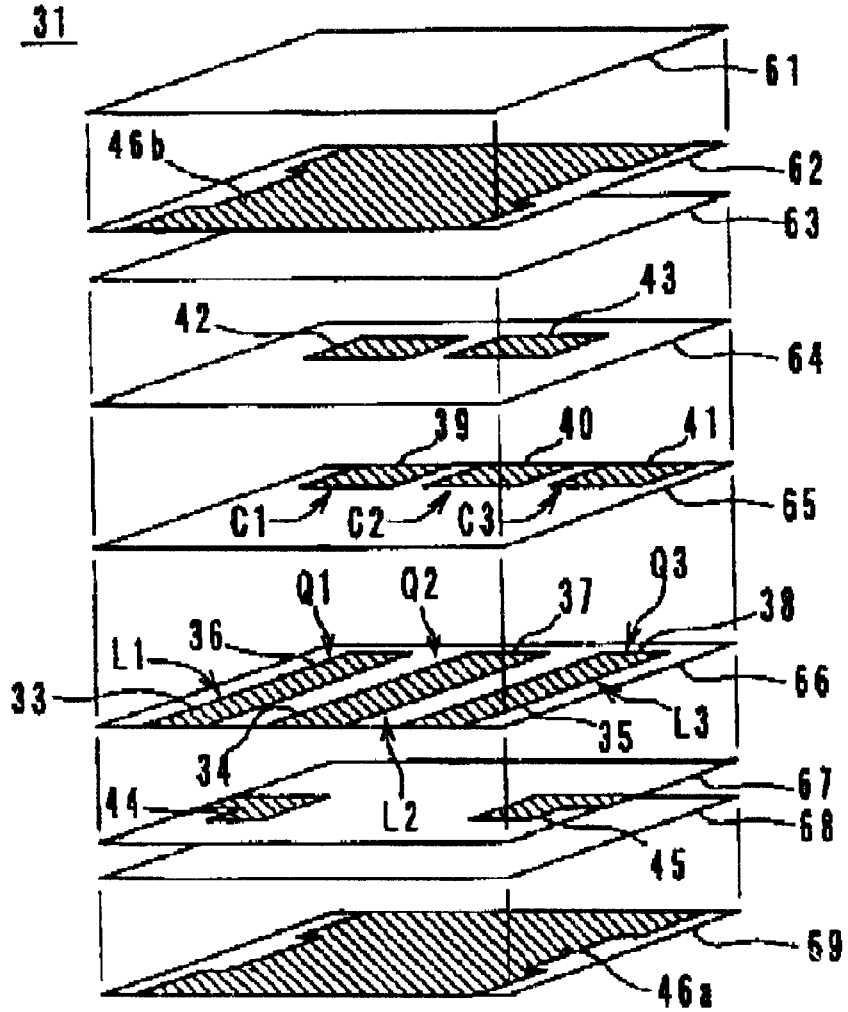
FIG. 1 is an exploded perspective view of an LC filter according to a first preferred embodiment of the present invention.
Figure 2:
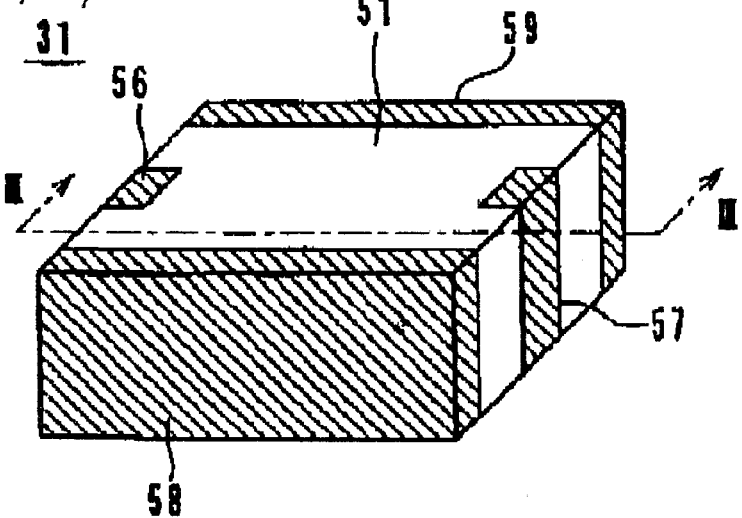
FIG. 2 is a perspective view of the laminated LC filter shown in FIG. 1.
Figure 3:
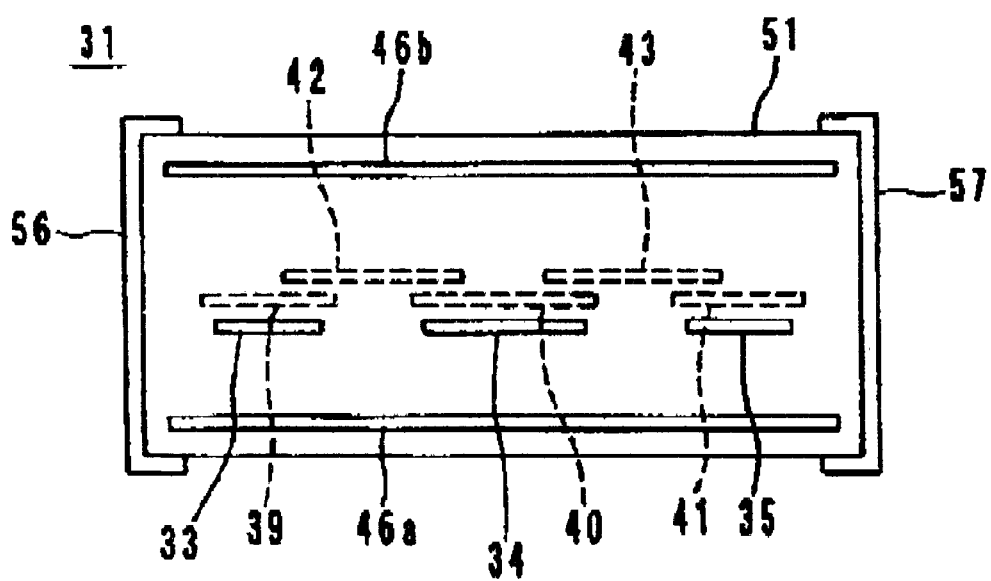
FIG. 3 is a schematic diagram as seen from III—III in FIG. 2.
Figure 8:
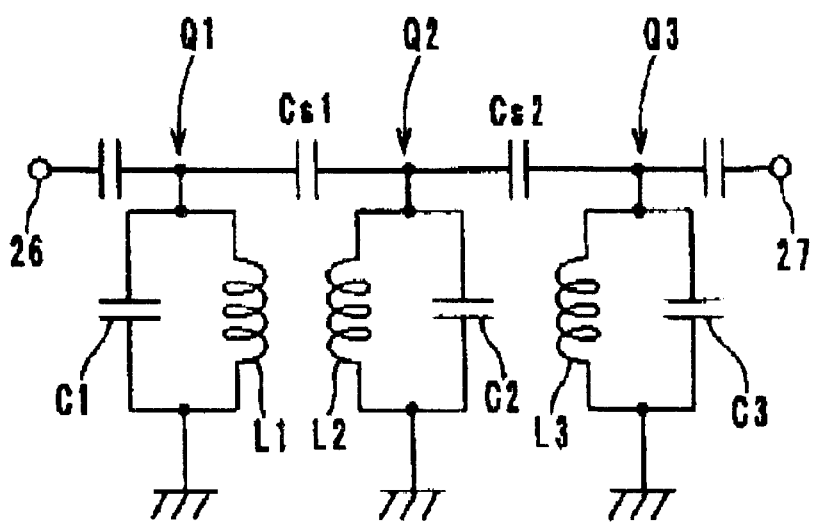
FIG. 8 is an electrical equivalent circuit diagram of the laminated LC filter.
Figure 9:
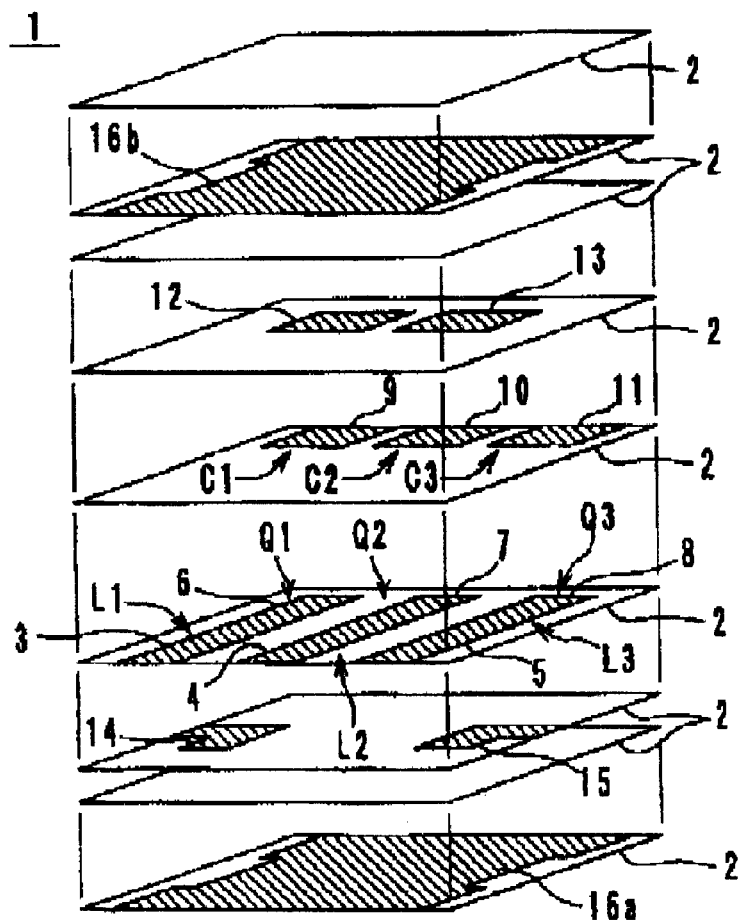
FIG. 9 is an exploded perspective view of a conventional laminated LC filter.
Figure 10:
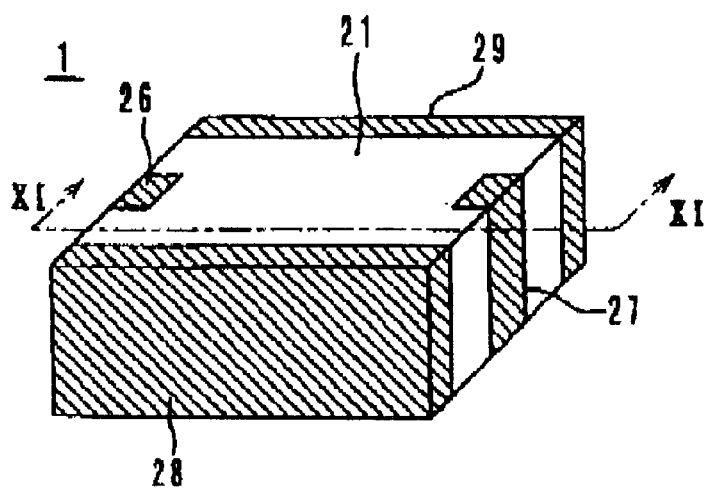
FIG. 10 is an appearance perspective view of the laminated LC filter shown in FIG. 9.
Figure 11:
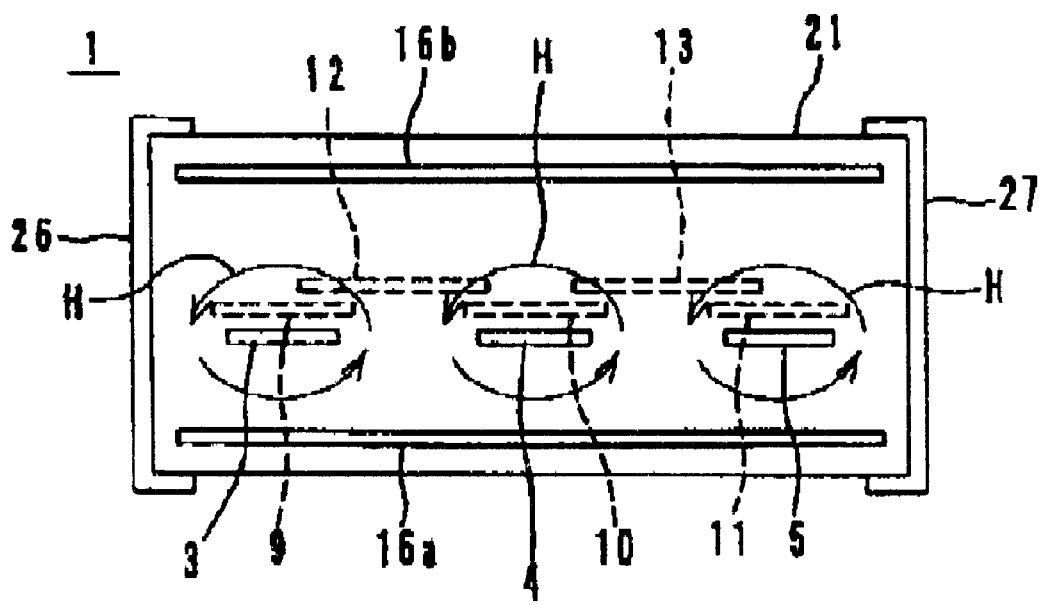
FIG. 11 is a schematic diagram showing as seen from XI—XI in FIG. 10.

A preferred embodiment of a band pass filter according to the present invention is shown in FIGS. 1 to 3. The band pass filter 31 is provided in the LC filter constructed of the LC resonators Q1 to Q3 at the first to third stages as shown in FIG. 8. The LC filter 31 includes a laminated body 51 constructed by laminating ceramic sheets 61 to 69 having generally square shapes made of a ceramic dielectric material such as a barium titanate and or other suitable ceramic dielectric materials, and subsequently by firing the laminated ceramic sheets 61 to 69 integrally.

As shown in FIG. 1, the inductor L1 of the LC resonator Q1 at the first stage (the initial stage) is defined by a strip-shaped inductor pattern 33. Further, the capacitor C1 of the LC resonator Q1 is defined by a capacitor pattern 39, and the leading edge 36 of the inductor pattern 33 that is disposed opposite to the capacitor pattern 39 via the sheet 65.

The inductor L2 of the LC resonator Q2 at the second stage is defined a strip-shaped inductor pattern 34. Further, the capacitor C2 of the LC resonator Q2 is defined by a capacitor pattern 40, and the leading edge 37 of the inductor pattern 34 that is disposed opposite to the capacitor pattern 40.

The inductor L3 of the LC resonator Q3 at the third stage is defined by a strip-shaped inductor pattern 35. Further, the capacitor C3 of the LC resonator Q3 is defined by a capacitor pattern 41, and the leading edge 38 of the inductor pattern 35 that is disposed opposite to the capacitor pattern 41.

The LC resonators Q1 to Q3 at the first to third stages are arranged such that the LC resonators Q1 and Q2 as well as the LC resonators Q2 and Q3, which are adjacent to each other, are electrically coupled by the coupling capacitor Cs1, Cs2, as seen in FIG. 8. Further, the LC resonators Q1 and Q3 are capacitive-coupled to the capacitor pattern 44 to define an input and capactive-coupled to the capacitor pattern 45 to define an output, respectively.

The inductor patterns 33, 34 and 35 provided at a left-side portion, at a approximately central portion, and at a right-side portion of the sheet 66, respectively, are such that one end of each inductor pattern 33, 34, and 35 is exposed at a front edge of the sheet 66. The capacitor patterns 39, 40 and 41 provided at a left-side portion, at a central portion, and at a right-side portion of the sheet 65, respectively, are such that one end of each capacitor pattern 39, 40, and 41 are exposed at a rear edge of the sheet 65. The inductor pattern 34 is arranged such that the pattern width thereof is at least approximately about 10% wider than the inductor patterns 33, 35 located at both end portions of the sheet 66.

The coupling capacitor patterns 42, 43 are arranged at a rear portion of the sheet 64, and are disposed opposite to the capacitor patterns 39, 40 41 through the sheet 64, and define the coupling capacitors Cs1, Cs2, respectively. Further, the inductor patterns 33, 35 are capacitive-coupled to the capacitor pattern 44 to define an input and to the capacitor pattern 45 to define an output, respectively, by sandwiching the sheet 66. The shielding patterns 46a, 46b are arranged to sandwich these patterns 33 to 35, 39 to 45.

As shown in FIG. 2, the laminated body 51 includes an input terminal electrode 56, an output terminal electrode 57 and shielding terminal electrodes 58, 59. The capacitor pattern 44 defining the input is connected to the input terminal electrode 56, the capacitor pattern 45 defining the output is connected to the output terminal electrode 57. The lead portions of the inductor patterns 33, 34, 35 and the one end portion of the each shielding pattern 46a, 46b is connected to the shielding terminal electrode 58. The lead portions of the capacitor patterns 39 to 41 and the other end portions of the shielding pattern 46a, 46b are connected to the shielding terminal electrode 59.

The LC filter described above is arranged such that the inductor pattern 34 defining the LC resonator Q2 at the second stage located at the approximate center portion has a pattern width that is at least approximately 10% wider that the inductor patterns 33, 35 defining the LC resonators Q1, Q3 at the first and third stages located at end portions of the sheet 66. This structure greatly reduces the magnetic field at the edges of the inductor pattern 34, resulting in an LC filter 31 having an excellent Q characteristic.

Figure 4:
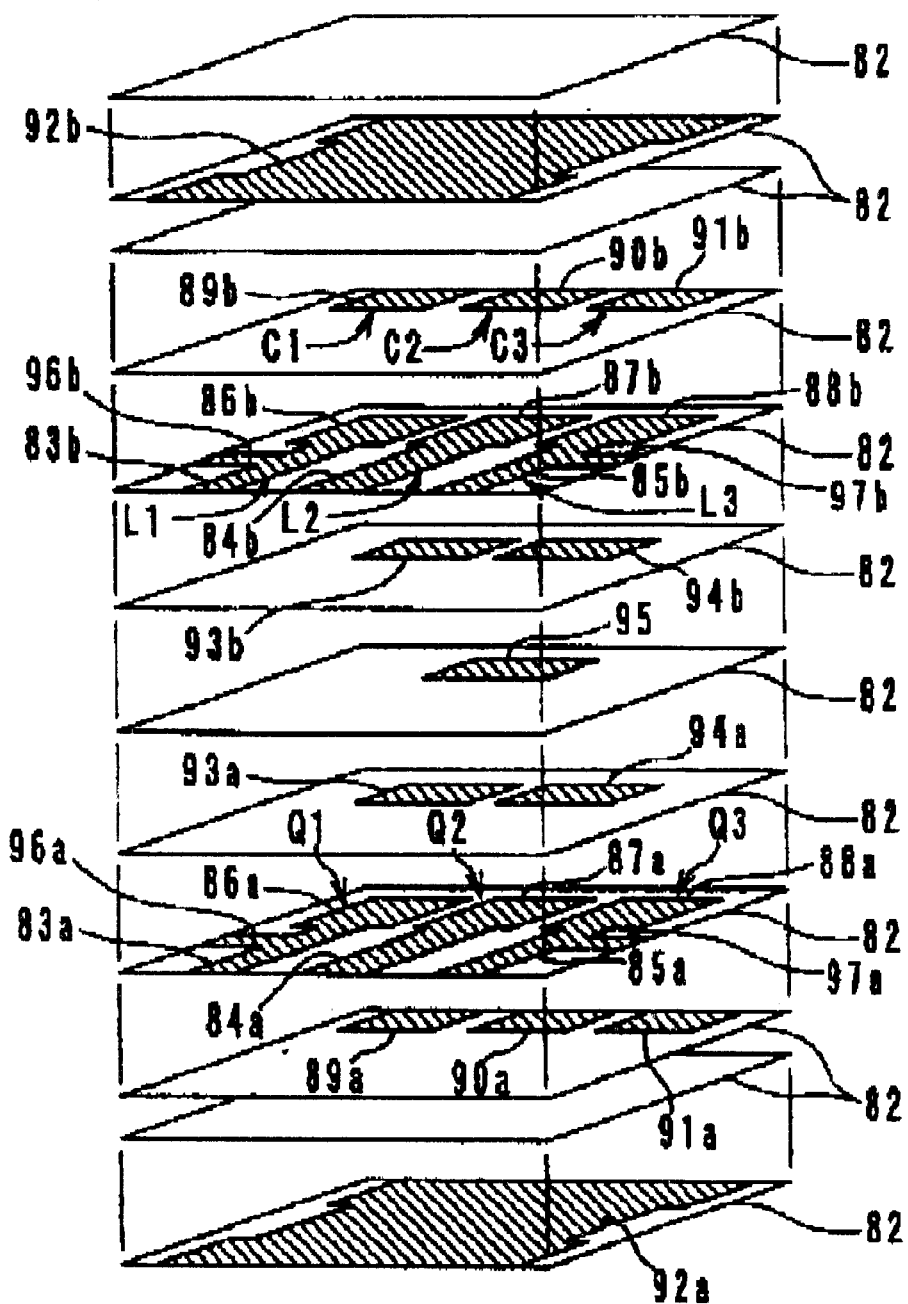
FIG. 4 is an exploded perspective view of a laminated LC filter according to a second preferred embodiment of the present invention.
Figure 5:
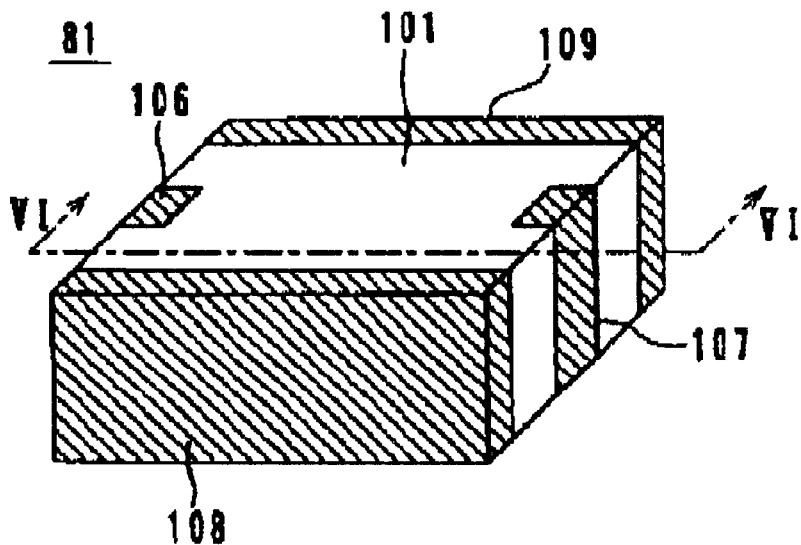
FIG. 5 is a perspective view of the laminated LC filter shown in FIG. 4.

FIG. 4 shows an LC filter 81 according to another preferred embodiment of the present invention, and FIG. 5 shows a perspective view of the LC filter 81. The LC filter 81 is a triple-stage LC band pass filter. LC resonator Q1 at the first stage (the initial stage), LC resonator Q2 at the second stage and LC resonator Q3 at the third stage (the end stage) are cascade-connected (daisy-chained) via the coupling capacitors Cs1, Cs2.

As shown in FIG. 4, the LC filter 81 includes a ceramic sheet 82 in which the inductor patterns 83a, 83b, 84a, 84b, 85a, 85b are provided respectively on the surface, a ceramic sheet 82 in which the capacitor patterns 89a, 89b, 90a, 90b, 91a, 91b are provided respectively on the surface, a ceramic sheet 82 in which the shielding patterns 92a, 92b are provided respectively on the surface, a ceramic sheet 82 in which the coupling capacitor patterns 93a, 93b, 94a, 94b are provided respectively on the surface, and a ceramic sheet 82 in which a pattern 95 for adjusting a pole, or making other adjustments is provided on the surface.

The inductor patterns 83a, 83b have similar shapes, and are laminated through the sheets 82. These inductor patterns 83a, 83b define an inductor L1 having a duplex structure. The inductor patterns 83a, 83b provided at left-side portions of the sheet 82 are such that one end of each inductor pattern 83a, 83b is exposed on a front edge of the sheet 82. The other end 86a, 86b of each inductor pattern 83a, 83b includes an increased width portion. These increased width portions 86a, 86b also function as the capacitor patterns. Input lead patterns 96a, 96b extend from the approximately central portions of the inductor patterns 83a, 83b, and are exposed on a left side portion of the sheet 82.

The inductor patterns 84a, 84b preferably have similar shapes, are laminated through the sheets 82, and define an inductor L2 having a duplex structure. The pattern widths of the inductor patterns 84a, 84b are about 10% or wider than the pattern widths of the inductor patterns 83a, 83b, 85a, 85b. The inductor patterns 84a, 84b are disposed at the approximate central portion of the sheet 82 such that one end of each inductor pattern 84a, 84b are exposed on a front edge portion of the sheet 82. The other ends 87a, 87b of the inductor patterns 84a, 84b include increased width portions. These increased width portions 87a, 87b also function as the capacitor patterns.

The inductor patterns 85a, 85b preferably have similar shapes, are laminated through the sheets 82, and define an inductor L3 having a duplex structure. The inductor patterns 85a, 85b disposed at the right-side portion of the sheet 82 are arranged such that one end of each inductor pattern 85a, 85b is exposed on front edge portion of the sheet 82. The other ends 88a, 88b of the inductor patterns 85a, 85b include increased width portions, and these increased width portions 88a, 88b also function as the capacitor patterns. The output lead patterns 97a, 97b extend from approximately the central portions of the inductor patterns 85a, 85b and are exposed on a right edge portion of the sheet 82.

The capacitor patterns 89a, 89b are disposed at a left-side portion of the sheet 82, and one end of each capacitor pattern 89a, 89b is exposed at a rear edge portion of the sheet 82. In the stacking direction of the sheets 82, an inductor L1 having a duplex structure including inductor patterns 83a, 83b is arranged between the capacitor patterns 89a, 89b. These capacitor patterns 89a, 89b are disposed opposite to the increased width portions 86a, 86b of the inductor patterns 83a, 83b, and define the capacitor C1. An LC parallel resonance circuit includes the capacitor C1 and the inductor L1 having the duplex structure, and defines the LC resonator Q1 at the first stage.

The capacitor patterns 90a, 90b are disposed at approximately the central portions of the sheet 82, and one end of each capacitor pattern 90a, 90b is exposed on a rear edge portion of the sheet 82. An inductor L2 having a duplex structure including the inductor patterns 84a, 84b is arranged between the capacitor patterns 90a and 90b. These capacitor patterns 90a, 90b are disposed opposite to the increased width portions 87a, 87b of the inductor patterns 84a, 84b, and define the capacitor C2. An LC parallel resonance circuit includes the capacitor C2 and the inductor L2 having the duplex structure, and defines the LC resonator Q2 at the second stage.

The capacitor patterns 91a, 91b are disposed at the right-side portion of the sheet 82, and one end of each capacitor pattern 91a, 91b is exposed at a rear edge portion of the sheet 82. An inductor L3 having a duplex structure that is defined by the inductor patterns 85a, 85b is arranged between the capacitor patterns 91a and 91b. These capacitor patterns 91a, 91b are disposed opposite to the increased width portions 88a, 88b of the inductor patterns 85a, 85b, and define the capacitor C3. An LC parallel resonance circuit includes the capacitor C3 and the inductor L3 of the duplex structure, and define the LC resonator Q3 at the third stage.

The coupling capacitor patterns 93a, 93b, 94a, 94b are provided at a rear edge portion of the sheet 82. In the stacking direction of the sheets 82, the coupling capacitor patterns 93a, 93b, 94a, 94b are disposed between the inductor patterns 83a, 84a, 85a and the inductor patterns 83b, 84b, 85b. The coupling capacitor patterns 93a, 93b are disposed opposite to the inductor patterns 83a, 83b, 84a, 84b by sandwiching the sheet 82, and define the coupling capacitor Cs1. The coupling capacitor patterns 94a, 94b are disposed opposite to the inductor patterns 84a, 84b, 85a, 85b by sandwiching the sheet 82, and define the coupling capacitor Cs2.

A pattern 95 for adjusting a pole is disposed between the coupling capacitor patterns 93a, 94a and 93b, 94b. This pattern 95 for adjusting the pole is disposed opposite to the coupling capacitor patterns 93a, 94a, 93b, 94b by sandwiching the sheet 82 and defines a capacitor. The shielding patterns 92a, 92b are such that one end of each shielding pattern 92a, 92b is exposed at a front edge portion of the sheet 82, and the other end of each shielding pattern is exposed at a rear edge portion.

Each sheet 82 as described above is stacked in sequence as shown in FIG. 4, and constitutes a laminated body 101, as shown in FIG. 5, by firing the stacked sheets 82 integrally. The input terminal electrode 106 and the output terminal electrode 107 are disposed at the left and right edge portions of the laminated body 101, respectively, and the shielding electrodes 108, 109 are disposed at the front and rear edge portions, respectively. The input lead patterns 96a, 96b are connected to the input terminal electrode 106, and the output lead patterns 97a, 97b are connected to the output terminal electrode 107. One end of each inductor pattern 83a to 85b and one end of each shielding pattern 92a, 92b are connected to the shielding terminal electrode 108. One end of each capacitor pattern 89a to 91b and the other end of each shielding pattern 92a, 92b are connected to the shielding terminal electrode 109.

Figure 6:
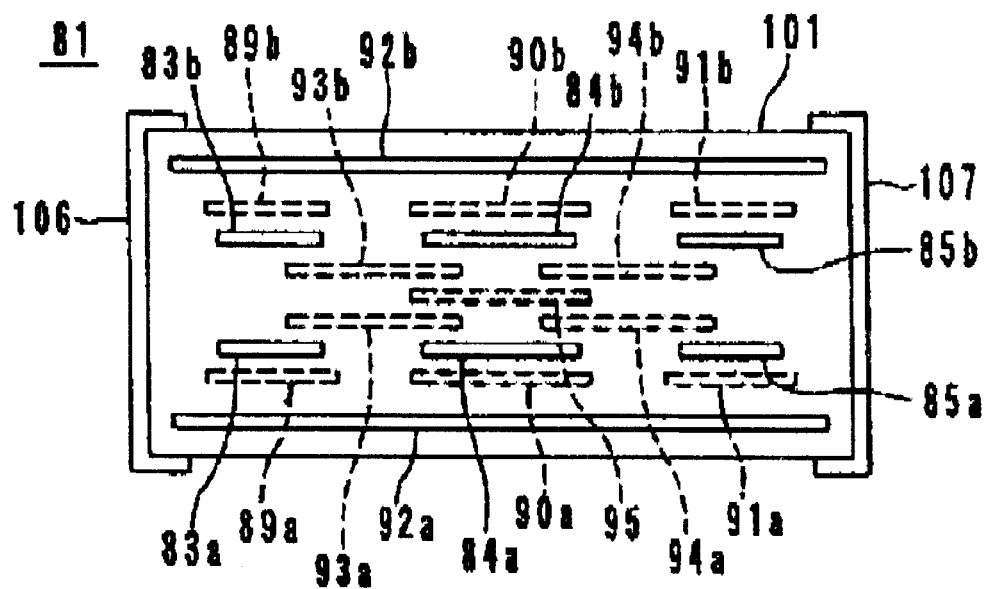
FIG. 6 is a schematic diagram as seen from VI—VI in FIG. 5.

As shown in FIG. 6, the LC filter 81 includes the inductor patterns 84a, 84b that define the LC resonator Q2 at the second stage located at approximately the center of the filter 81. The inductor patterns 84a, 84b have pattern widths which are at least about 10% wider than the pattern widths of the inductor patterns 83a, 83b, 85a, 85b that define the LC resonators Q1, Q3 at the first and third stages which are located at the end portions of the LC filter 81. Accordingly, the magnetic field H at the edge portions of the inductor patterns 84a, 84b is greatly reduced. As a result, the Q characteristic of the LC filter is greatly improved.

Further, because the inductors L1 to L3 are duplex structures, the distribution of the magnetic field H generated in the vicinity of the inductors L1 to L3 is greatly improved by adjusting a space between the inductor patterns 83a and 83b, a space between the inductor patterns 84a and 84b, and a space between the inductor patterns 85a and 85b. As a result, the magnetic field H is further reduced at the edge portions of the inductor patterns 83a to 85b. Consequently, the Q characteristic of the LC filter is greatly improved.

Moreover, no magnetic field is generated between the inductor patterns 83a and 83b, between the inductor patterns 84a and 84b, or between the inductor pattern 85a and 85b that define each of the inductors L1 to L3. Therefore, the coupling capacitor patterns 93a to 94b disposed between the inductor patterns 83a, 84a, 85a and 83b, 84b 85b and the pattern 95 for adjusting the pole rarely block the magnetic field H of the inductors L1 to L3. As a result, a uniform magnetic field H is generated, thereby greatly increasing the inductance.

Figure 7:
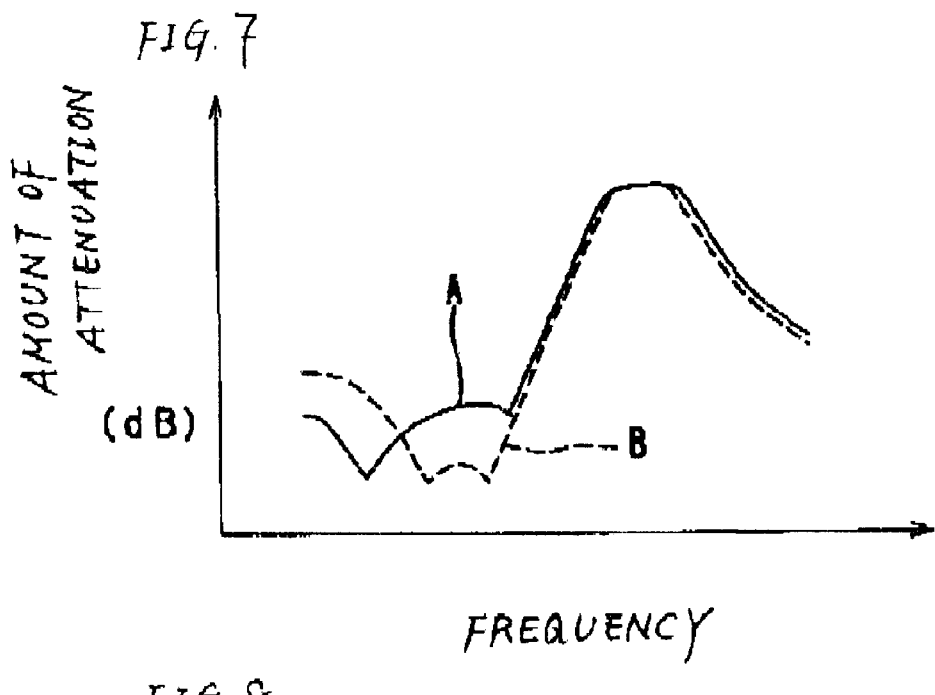
FIG. 7 is a graph showing an attenuation characteristic of the laminated LC filter shown in FIG. 5.

Further, by varying the opposed areas of the pattern 95 for adjusting the pole and the coupling capacitor patterns 93a to 94b, the pole distance of the LC filter 81 can be adjusted. For example, when the opposed areas are large, the capacitance that is generated between the pattern 95 for adjusting the pole and the coupling capacitor patterns 93a to 94b increases, and as shown with the solid line A in FIG. 7, the attenuation characteristic achieves a large distance between poles. Conversely, when the opposed areas are small, as shown with the dotted line B in FIG. 7, the attenuation characteristic achieves a small distance between poles.

The laminated LC filter of the present invention is not limited to the preferred embodiments described above, and may be embodied in other specific forms without departing from the spirit or essential characteristics thereof. For example, the number LC resonators included in the laminated LC filter may be four or more. When there are four or more LC resonators, the improved characteristics can be obtained by providing at least one inductor pattern at an approximately central portion having a width greater than the widths of the other inductors.

Further, the ceramic sheets may be fired before the sheets are stacked. Moreover, the LC filter may be produced by a different manufacturing method. In this method, after having formed a ceramic layer with a ceramic material in a paste form by a method of printing and other suitable methods, an arbitrary pattern is formed by applying a conductive pattern material in a paste form on a surface of the ceramic layer. Then, a ceramic material is applied in a paste form on the conductive pattern, thus producing the ceramic layer in which the conductive pattern is provided. By repeating this sequence, an LC filter with a laminated structure is produced.

As apparent from the above description, according to the present invention, since the pattern widths of the inductor patterns that define the LC resonators located at other than the end portions are made wider than the pattern widths of the inductor patterns that define the LC resonators located at both end portions, the magnetic field at the edge portions of the inductor patters of the LC resonators located at other than both ends is greatly reduced. As a result, the Q characteristic of the laminated LC filter is greatly improved.

Further, by making the inductors to be multiplex structures, the magnetic field at the edge portions of the inductor patterns is further reduced.

The invention may be embodied in other specific forms without departing from the spirit or essential characteristics thereof. The preferred embodiments are therefore to be considered in all respects as illustrative and not restrictive, the scope of the invention being indicated by the appended claims rather than by foregoing description and all changes which come within the meaning and range of equivalency of the claims are therefore intended to be embraced therein.

What is claimed is:

1. A laminated LC filter, comprising:
    a laminated body including a plurality of insulation layers, a plurality of inductor patterns, and a plurality of capacitor patterns in a stacked arrangement; and
    at least three LC resonators having a plurality of inductors defined by said plurality of inductor patterns, and a plurality of capacitors defined by said plurality of capacitor patterns, said plurality of capacitors arranged such that said capacitor patterns are disposed opposite to said inductor patterns inside of said laminated body; wherein a filter having at least three stages is defined by
        at least three of said LC resonators connected to each other, the pattern widths of the inductor patterns of the LC resonators disposed at locations between both end portions of one of the plurality of insulation layers are wider than the pattern widths of the inductor patterns of the LC resonators located at both end portions of said one of the plurality of insulation layers.

2. A laminated LC filter according to claim 1, wherein each of said plurality of inductors of the respective LC resonators has a multiplex structure in which at least two of said plurality of inductor patterns having substantially similar shapes are laminated via said insulation layers.

3. A laminated LC filter according to claim 1, wherein a plurality of capacitor patterns defining an input connection and an output connection are laminated between the inductor patterns of said inductors.

4. A laminated LC filter according to claim 1, wherein each,of the plurality of inductor patterns includes increased width portions at one end thereof.

5. A laminated LC filter according to claim 1, wherein the plurality of inductor patterns include increased width portions that define capacitor patterns.

6. A laminated LC filter according to claim 1, further comprising coupling capacitor patterns arranged between the inductor patterns of said inductors to capacitive-couple said LC resonators.

7. A laminated LC filter according to claim 1, wherein patterns arranged to achieve pole adjustment are laminated between the inductor patterns of said inductors.

8. A laminated LC filter according to claim 1, wherein the coupling capacitor patterns are arranged opposite to the increased width portions of the inductor portions.

9. A laminated LC filter according to claim 1, further comprising shielding patterns connected to the capacitor patterns.

10. A laminated LC filter according to claim 1, wherein each of said plurality of inductor patterns of said at least three LC resonators extends substantially to a front edge portion of the laminated body.

* * * * *